(12) United States Patent
Gupta et al.

(10) Patent No.: US 11,386,937 B2
(45) Date of Patent: Jul. 12, 2022

(54) SYSTEM DEVICE AND METHOD FOR PROVIDING SINGLE PORT MEMORY ACCESS IN BITCELL ARRAY BY TRACKING DUMMY WORDLINE

(71) Applicant: Arm Limited, Cambridge (GB)

(72) Inventors: Lalit Gupta, Cupertino, CA (US); Nicolaas Klarinus Johannes Van Winkelhoff, Roquefort-les-pins (FR); Bo Zheng, Cupertino, CA (US); El Mehdi Boujamaa, Valbonne (FR); Fakhruddin Ali Bohra, San Jose, CA (US)

(73) Assignee: Arm Limited, Cambridge (GB)

(*) Notice: Subject to any disclaimer, the term of this patent is extended or adjusted under 35 U.S.C. 154(b) by 0 days.

(21) Appl. No.: 16/600,483

(22) Filed: Oct. 12, 2019

(65) Prior Publication Data
US 2021/0110853 A1 Apr. 15, 2021

(51) Int. Cl.
*G11C 7/10* (2006.01)
*G11C 11/419* (2006.01)
*G11C 11/418* (2006.01)
*G11C 11/16* (2006.01)

(52) U.S. Cl.
CPC ........ *G11C 7/1015* (2013.01); *G11C 11/1653* (2013.01); *G11C 11/1659* (2013.01); *G11C 11/1673* (2013.01); *G11C 11/1675* (2013.01); *G11C 11/1693* (2013.01); *G11C 11/418* (2013.01); *G11C 11/419* (2013.01)

(58) Field of Classification Search
CPC . G11C 7/1015; G11C 11/1653; G11C 11/419; G11C 11/1673; G11C 11/1675; G11C 11/1693; G11C 11/418; G11C 11/1659
See application file for complete search history.

(56) References Cited

U.S. PATENT DOCUMENTS

| | | | | |
|---|---|---|---|---|
| 5,796,659 A * | 8/1998 | Hegi | ............ | G11C 11/419 |
| | | | | 365/189.03 |
| 6,172,925 B1 * | 1/2001 | Bloker | ............ | G11C 7/06 |
| | | | | 365/203 |
| 6,314,047 B1 * | 11/2001 | Keay | ............ | G11C 8/16 |
| | | | | 365/189.02 |
| 6,483,754 B1 * | 11/2002 | Agrawal | ............ | G11C 7/22 |
| | | | | 365/189.04 |
| 6,714,472 B2 * | 3/2004 | Wilkins | ............ | G11C 7/06 |
| | | | | 365/194 |

(Continued)

*Primary Examiner* — Tammara R Peyton
(74) *Attorney, Agent, or Firm* — Pramudji Law Group PLLC; Ari Pramudji

(57) ABSTRACT

Various implementations described herein refer to a method for providing single port memory with a bitcell array arranged in columns and rows. The method may include coupling a wordline to the single port memory including coupling the wordline to the columns of the bitcell array. The method may include performing multiple memory access operations concurrently in the single port memory including performing a read operation in one column of the bitcell array using the wordline while performing a write operation in another column of the bitcell array using the wordline, or performing a write operation in one column of the bitcell array using the wordline while performing a read operation in another column of the bitcell array using the same wordline.

20 Claims, 8 Drawing Sheets

(56) References Cited

U.S. PATENT DOCUMENTS

| | | | |
|---|---|---|---|
| 7,092,279 B1* | 8/2006 | Sheppard | G11C 7/02 |
| | | | 257/E21.656 |
| 9,858,988 B1* | 1/2018 | Ghosh | G11C 7/08 |
| 9,870,818 B1* | 1/2018 | Garg | G11C 8/08 |
| 9,953,701 B1* | 4/2018 | Bohra | G11C 11/419 |
| 10,943,670 B1* | 3/2021 | Gupta | G11C 7/14 |
| 2010/0088484 A1 | 4/2010 | Roohparvar | |
| 2010/0157715 A1* | 6/2010 | Pyeon | G11C 11/413 |
| | | | 365/230.05 |
| 2011/0317484 A1 | 12/2011 | Choi | |
| 2013/0121086 A1 | 5/2013 | Terzioglu et al. | |
| 2014/0119130 A1* | 5/2014 | Trivedi | G11C 7/14 |
| | | | 365/189.02 |
| 2015/0131365 A1* | 5/2015 | Hsieh | G11C 8/18 |
| | | | 365/154 |
| 2015/0254009 A1 | 9/2015 | Eguchi et al. | |
| 2015/0310904 A1 | 10/2015 | Kim et al. | |
| 2020/0034054 A1 | 1/2020 | Zamsky et al. | |
| 2020/0327932 A1* | 10/2020 | Verma | G11C 7/222 |
| 2021/0098032 A1 | 4/2021 | Gupta et al. | |

* cited by examiner

SYSTEM DEVICE AND METHOD FOR PROVIDING SINGLE PORT MEMORY ACCESS IN BITCELL ARRAY BY TRACKING DUMMY WORDLINE

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Memory compilers utilize configuration data to generate physical layout designs of memory circuitry for read and write access operations. Traditional memory compilers examine characterized data to develop various memory instances that cover the memory compiler space. However, some traditional techniques typically introduce accuracy errors in reference to memory instance data. In some cases, various leakage, timing, power and noise data for the memory instances is stored, and some traditional memory compilers typically analyze error prone memory instances related to entire memory circuits, gather results and then compute a final result. However, traditional techniques are costly, time consuming and inefficient, and traditional techniques may cause accuracy errors because some memory instances are sensitive to a number of rows (e.g., bitcells, columns, and/or wordline drivers). Also, in some cases, only a single wordline in one bank is accessible in some bank architectures, wherein users perform either a read operation or a write operation. Thus, there exists a need to improve physical design implementation of some memory circuits to provide for more efficient read and write access operations.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are related to read and write memory access schemes and techniques that improve read and write operations in physical layout design of memory architecture. For instance, various schemes and techniques described herein may provide for a system or a device having a single port memory architecture that supports dual wordline circuitry. In some instances, the access schemes and techniques described herein may be configured to perform concurrent memory access operations in single port memory, such as, e.g., performing a read operation in one column of the bitcell array using the wordline while performing a write operation in another column of the bitcell array using the wordline, or performing a write operation in one column of the bitcell array using the wordline while performing a read operation in another column of the bitcell array using the same wordline.

In some implementations, memory access schemes and techniques described herein may refer to memory architecture configured to squeeze the write pulse without impacting read operations in dual wordline architecture so as to increase write error rate (WER) for improved endurance. Thus, write failure may be exaggerated by increasing write error rate (WER) without impacting read operations. Also, when read and write operations are performed through dual wordline architecture or the same wordline with different read and write column addresses, control logic may be used to deactivate write operations or perform write operations at higher speed to increase the write error rate (WER) to not impact read operations. In some memory applications, delay logic may be used in a self-timed path (STP) so as to increase the timing of the STP path, and the write driver clock may be deactivated after dummy wordline (dwl) tracking along with fixed delay. In this instance, memory access schemes and techniques described herein may provide for controlling the write clock pulse width based on using fixed delays in the STP. In some instances, the fixed delays may be implemented with resistor-capacitor (RC) delays.

Various implementations of read and write access schemes and techniques will be described in detail herein with reference to FIGS. 1-5.

Figure 1:
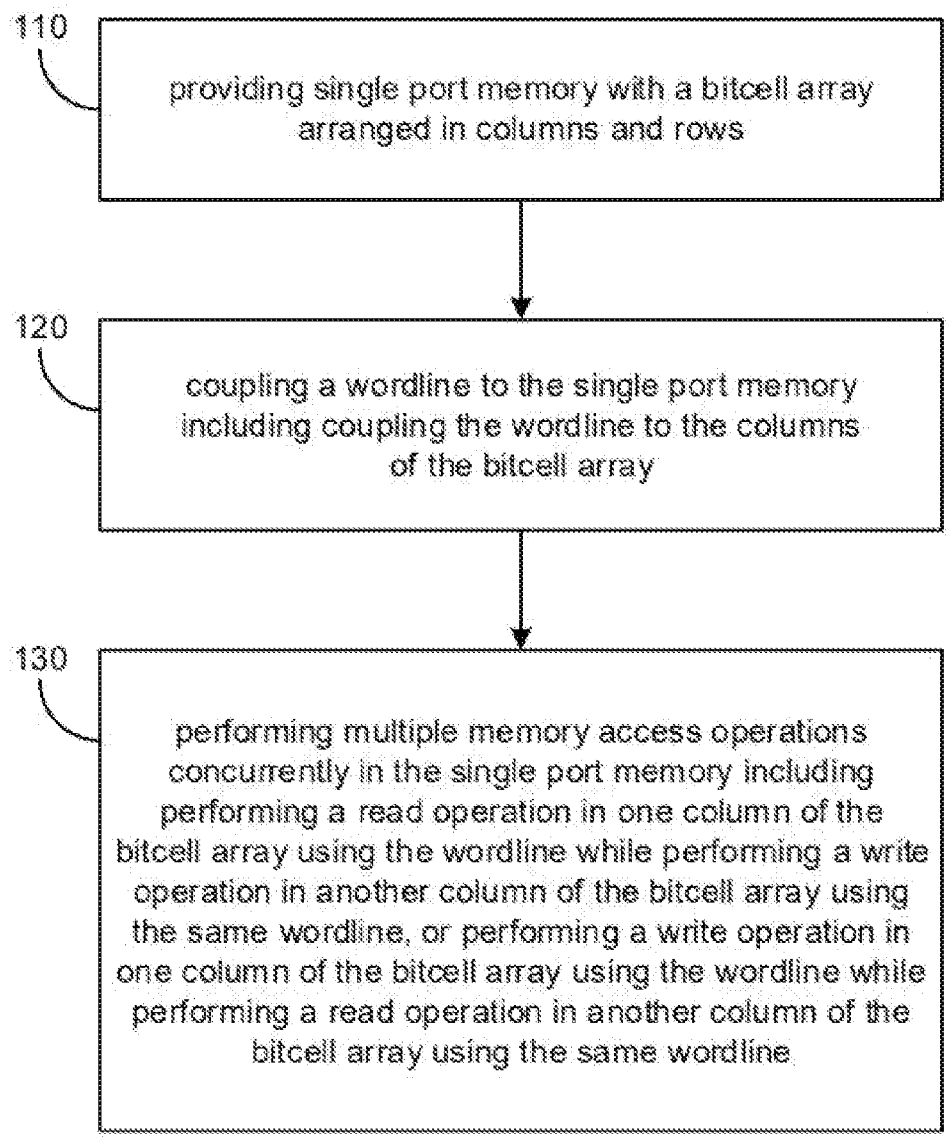
FIG. 1 illustrates a process diagram of a method for accessing memory with dual wordline circuitry in accordance with implementations described herein.

FIG. 1 illustrates a process diagram of a method 100 for accessing memory with dual wordline circuitry in accordance with implementations described herein.

It should be understood that even though method 100 may indicate a particular order of operation execution, in some cases, various portions of the operations may be executed in a different order, and on different systems. Additional operations and/or steps may be added to and/or omitted from method 100. Also, method 100 may be implemented in hardware and/or software. For instance, if implemented in hardware, method 100 may be implemented with various components and/or circuitry, as described herein below in reference to FIGS. 2A-5. In other instances, if implemented in software, method 100 may be implemented as various programs and/or software instruction processes that are configured for various read and write memory access techniques described herein. Also, if implemented in software, instructions related to implementing features and aspects of method 100 may be stored in memory and/or a database. In other instances, a computer or various other types of computing devices having at least one processor and memory may be configured to perform method 100.

In reference to FIG. 1, in block 110, method 100 may provide single port memory with a bitcell array arranged in columns and rows. In block 120, method 100 may couple a wordline (WL) to the single port memory including coupling the wordline (WL) to the columns of the bitcell array. In some instances, the single port memory may include a column multiplexer (colmux or cmux) that is coupled to the bitcell array for accessing bitcells in the bitcell array in combination with the wordline (WL).

In block 130, method 100 may perform multiple memory access operations concurrently in the single port memory. For instance, method 100 may perform a read operation in one column of the bitcell array using the wordline (WL) while performing a write operation in another column of the bitcell array using the wordline (WL). In some instances, method 100 may perform a write operation in one column of the bitcell array using the wordline (WL) while performing a read operation in another column of the bitcell array using the same wordline (WL). In other instances, such as a dual wordline scenario, method 100 may be configured to perform a write operation in one bank (e.g., first bank) of the bitcell array using one wordline (e.g., first WL) while performing a read operation in another bank (e.g., second bank) of the bitcell array using another wordline (e.g., second WL) that is different than the one wordline (e.g., first WL).

The read operation is performed in the bitcell array with a read column address (RCA) while the write operation is performed concurrently in the same bitcell array with a write column address (WCA). Otherwise, the write operation is performed in the bitcell array with the write column address (WCA) while the read operation is performed concurrently in the bitcell array with a read column address (RCA). In addition, different memory addresses may be used to perform the multiple memory access operations concurrently in the bitcell array of the single port memory, and the different memory addresses refer to the write column address (WCA) and the read column address (RCA) that is different than the write column address (WCA).

Figure 3:
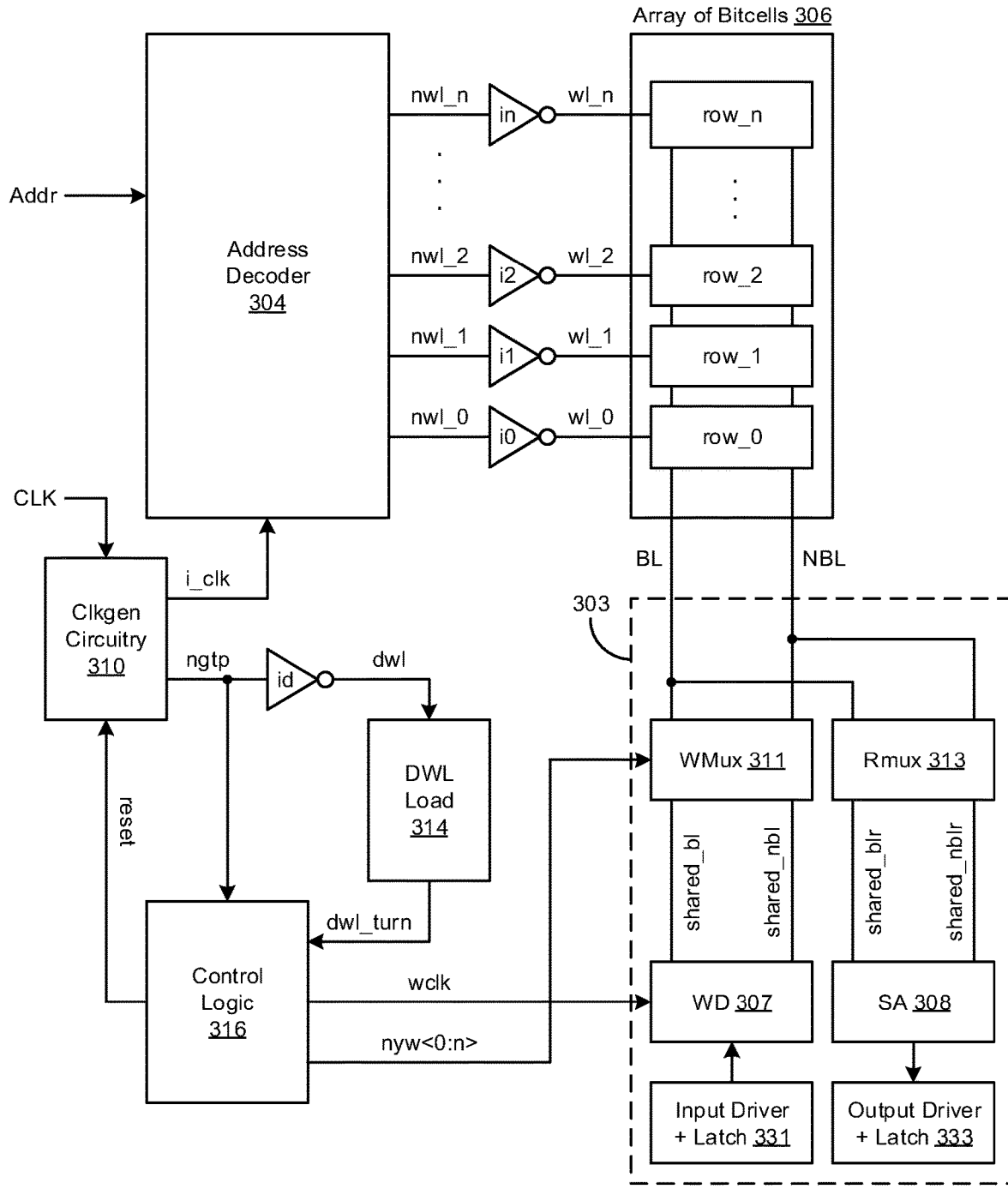
FIG. 3 illustrates a diagram of memory circuitry in accordance with various implementations described herein.

In some instances, method 100 may track a dummy wordline (DWL) having fixed delays (e.g., one or more fixed delays) coupled along a self-timed path (STP) of the dummy wordline (DWL), and the fixed delays may be used to affect timing of a write clock signal (wclk) provided to the column multiplexer (colmux). Also, method 100 may control the pulse width of the write clock signal (wclk) based on using the fixed delays in the self-timed path (STP) of the dummy wordline (DWL). In some instances, controlling the pulse width of the write clock signal (wclk) may refer to modulating the pulse width of the write clock signal (wclk) so as to thereby increase a write error rate (WER) without impacting the read operation. Also, outputs of the fixed delays may be provided as inputs to a write clock multiplexer (Wmux) that selectively provide a reset signal (reset) based on a selection signal, and one or more logic gates may be arranged to receive the reset signal (reset), receive a global timing pulse (gtp) signal, receive a global write enable (gwen) signal, and provide the write clock signal (wclk) to the write driver (WD) circuitry, e.g., as shown in FIG. 3.

In some implementations, method 100 may use a global write enable signal (gwen) along with a write bank address (WBA), a row address, and a column address to perform the write operation in the first bank or the second bank, and also, method 100 may use a global read enable signal (gren) along with a read bank address (RBA), the row address, and the column address to perform the read operation in the first bank or the second bank. In some instances, the first bank may include an array of bitcells that are arranged in columns and rows, and also, the second bank may have another array of bitcells arranged in columns and rows. Further, in some instances, the single port memory may refer to static random access memory (SRAM) or magneto-resistive RAM (MRAM), and the bitcells may refer to SRAM bitcells or MRAM bitcells, respectively.

Figure 2A:
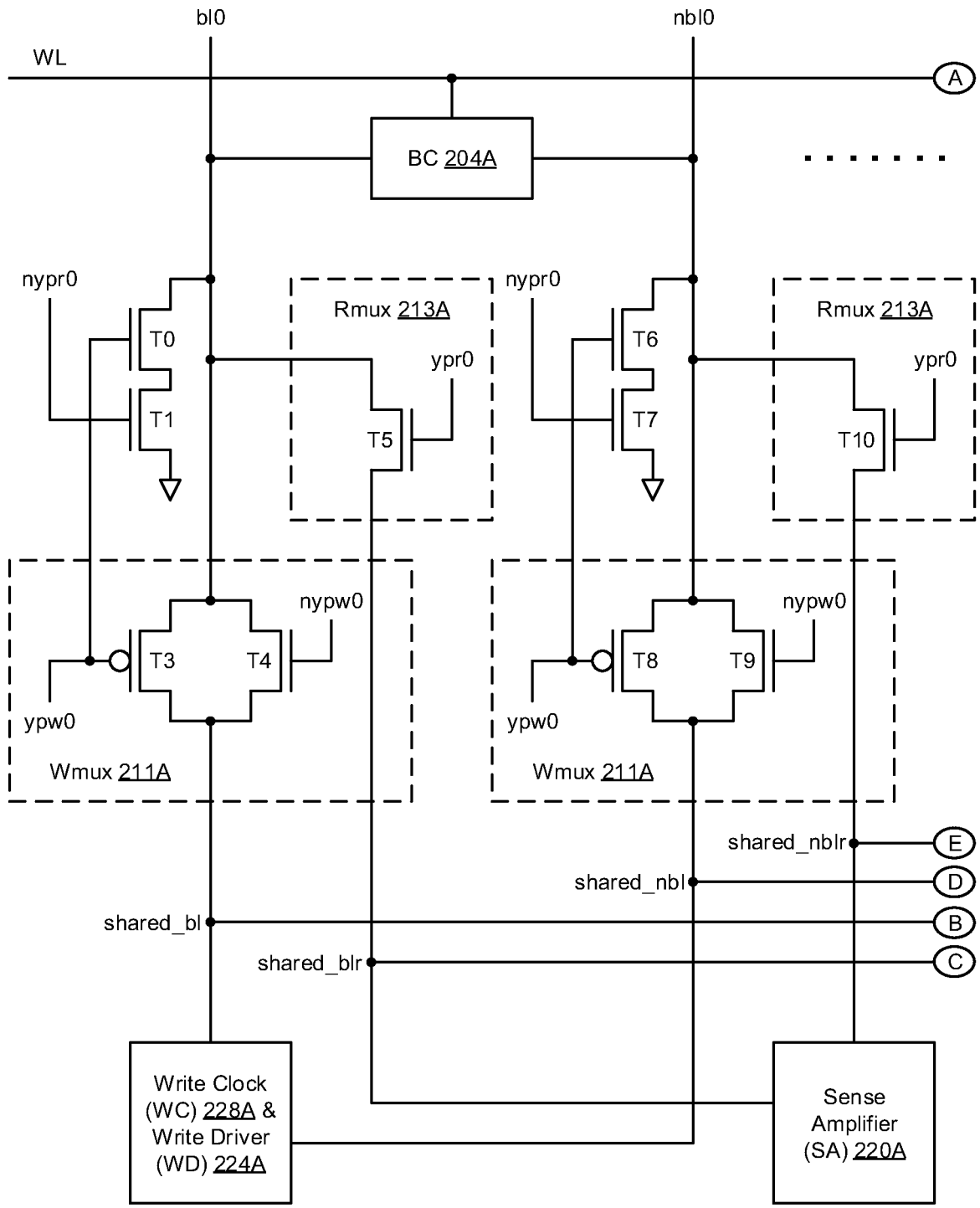
FIGS. 2A-2C illustrate column multiplexer circuitry in accordance with various implementations described herein.
Figure 2B:
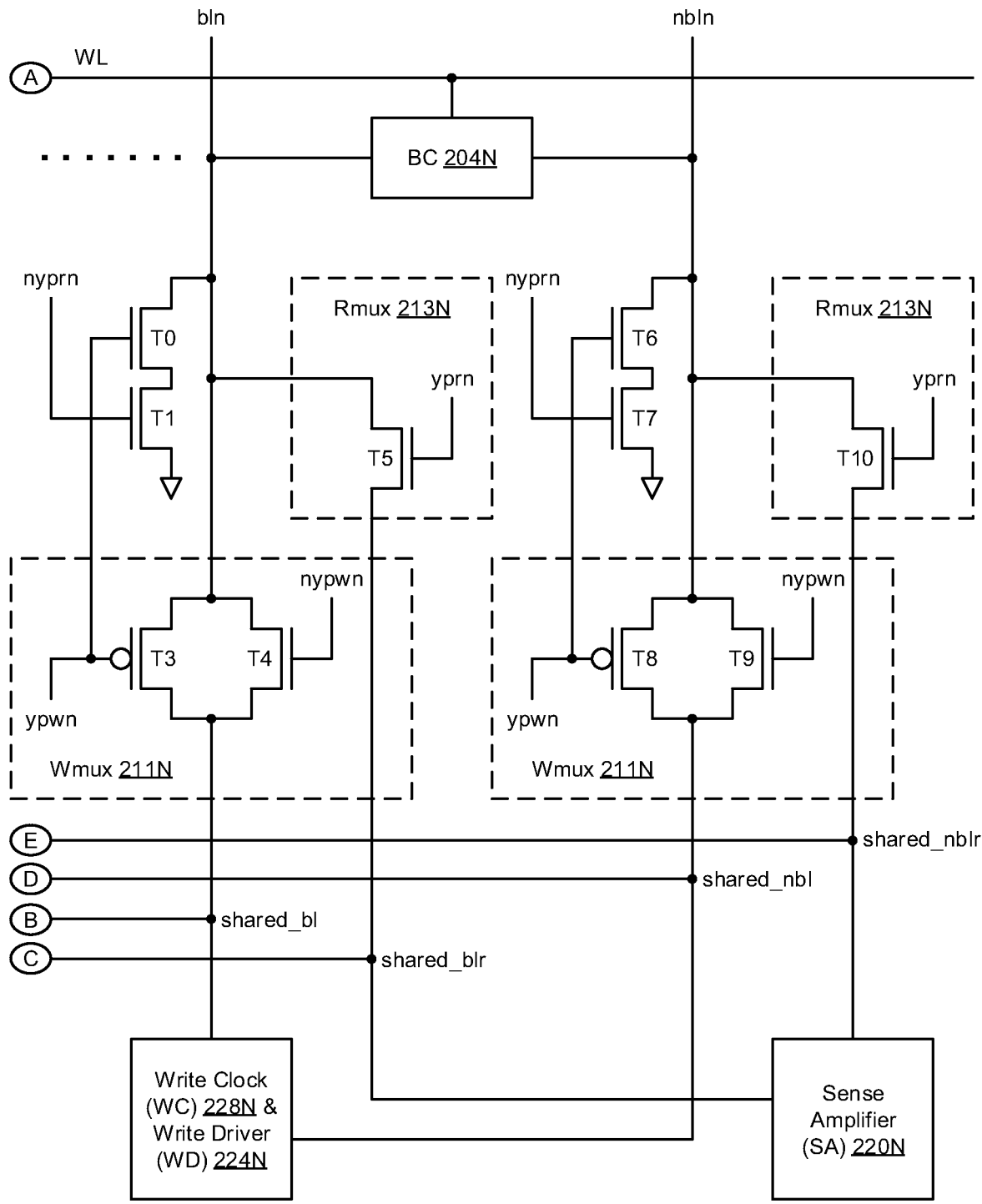
Figure 2C:
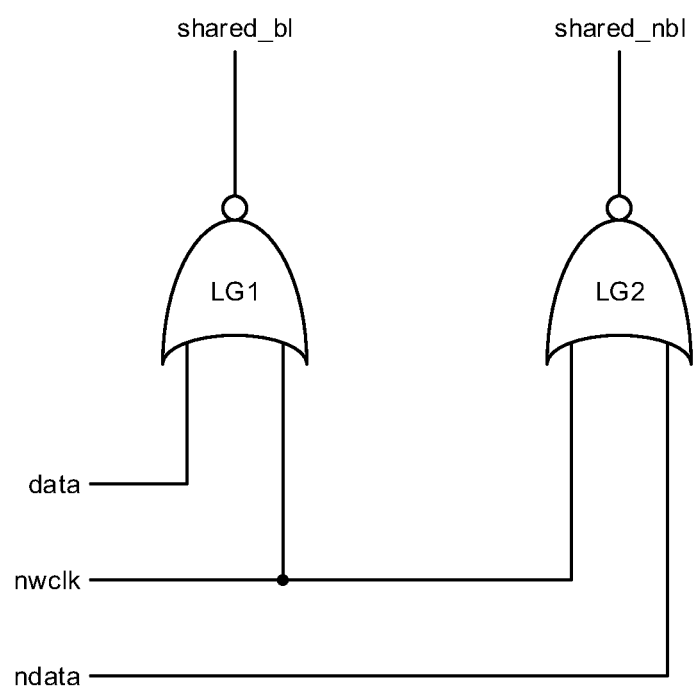

FIGS. 2A-2C illustrate column multiplexer circuitry 200 having write clock (wclk) circuitry 228 in accordance with implementations described herein. In particular, FIG. 2A illustrates a first part 200A of the column multiplexer circuitry 200, and FIG. 2B illustrates a second part 200B of the column multiplexer circuitry 200. Also, as shown in FIGS. 2A-2B, the first part 200A is coupled to the second part 200B via encircled elements A, B, C, D, E. Further, FIG. 2C illustrates a detailed diagram 200C of the write clock (wclk) circuitry 228, which is part of the column multiplexer circuitry 200.

In reference to FIG. 2A, the first part 200A of the column multiplexer circuitry 200 may refer to a transistor-level dual y-mux 202A. The first part 200A may include at least one bitcell 204A, write clock (WC) circuitry 228A, write driver (WD) circuitry 224A, and a sense amplifier 220A coupled to complementary bitlines (bl0, nbl0), and a wordline (WL) may also be coupled to the at least one bitcell 204A. In some instances, the WD circuitry 224A may operate as part of the WC circuitry 228A. The first part 200A includes precharge transistors (T0, T1) coupled in series to the bitline (bl0), wherein transistor (T0) is coupled between bitline (bl0) and transistor (T1), and transistor (T1) is coupled between transistor (T0) and ground (Vss or Gnd). The gate of transistor (T0) is coupled to the gate of pass transistor (T3), and the gate of transistor (T1) receives a read activation signal (nypr0). The first part 200A may include pass transistors (T3, T4) that are coupled in parallel between bitline (bl0) and the write clock (WC) circuitry 228A. Also, the gate of transistor (T3) receives a write activation signal (ypw0), and the gate of transistor (T4) receives a complementary write activation signal (nypw0). In addition, the first part 200A may include another pass transistor (T5) that is coupled between the bitline (bl0) and the sense amplifier (SA) 220A, and the gate of transistor (T5) receives a complementary read activation signal (ypr0). In some instances, transistors (T3, T4) may operate as part of write multiplexer circuitry (Wmux) 211A, and transistor (T5) may operate as part of read multiplexer circuitry (Rmux) 213A.

Further, in reference to bitline (nbl0), the first part 200A may include precharge transistors (T6, T7) coupled in series to the bitline (nbl0), wherein transistor (T6) is coupled between bitline (nbl0) and transistor (T7), and transistor (T7) is coupled between transistor (T6) and ground (Vss or Gnd). The gate of transistor (T6) is coupled to the gate of pass transistor (T8), and the gate of transistor (T7) receives the read activation signal (nypr0). The first part 200A may also include pass transistors (T8, T9) that are coupled in parallel between bitline (nbl0) and the write clock (WC) circuitry 228A. Also, the gate of transistor (T8) receives the write activation signal (ypw0), and the gate of transistor (T9) receives the complementary write activation signal (nypw0). In addition, the first part 200A includes another pass transistor (T10) that is coupled between the bitline (nbl0) and the sense amplifier (SA) 220A, and also, the gate of transistor (T10) receives the complementary read activation signal (ypr0). In some instances, transistors (T8, T9) may operate as part of write multiplexer circuitry (Wmux) 211A, and transistor (T10) may operate as part of read multiplexer circuitry (Rmux) 213A. Also, the write clock (WC) circuitry 228A and the sense amplifier (SA) 220A may be cross-coupled between the bitlines (bl0, nbl0).

In some implementations, the first part 200A refers to a first column structure in an array of bitcells, and the second part 200B refers another column structure in the same array of bitcells. The array of bitcells may include any number (N) of columns and any number (N) of column structures to support read and write memory access operations as described herein. Therefore, as shown in FIGS. 2A-2B, the second part 200B may have similar components with similar scope and features as the first part 200A.

In FIG. 2B, the second part 200B of the column multiplexer circuitry 200 may refer to another transistor-level dual y-mux 202B. The second part 200B may include at least one bitcell 204N, write clock (WC) circuitry 228N, write driver (WD) circuitry 224N, and a sense amplifier 220N coupled to complementary bitlines (bln, nbln), and the wordline (WL) may be coupled to the at least one bitcell 204N. In some instances, the WD circuitry 224N may operate as part of the WC circuitry 228N. Similar to the first part 200A, the second part 200B may include precharge transistors (T0, T1) coupled in series to the bitline (bln), wherein transistor (T0) is coupled between bitline (bln) and transistor (T1), and transistor (T1) is coupled between transistor (T0) and ground (Vss or Gnd). The gate of transistor (T0) is coupled to the gate of pass transistor (T3), and the gate of transistor (T1) receives a read activation signal (nyprn). The second part 200B may include pass transistors (T3, T4) that are coupled in parallel between bitline (bln) and the write clock (WC) circuitry 228N, wherein the gate of transistor (T3) receives a write activation signal (ypwn), and the gate of transistor (T4) receives a complementary write activation signal (nypwn). Also, the second part 200B may include another pass transistor (T5) that is coupled between the bitline (bln) and the write driver (WD) 224N, and also, the gate of transistor (T5) receives a complementary read activation signal (yprn). In some instances, transistors (T3, T4) may operate as part of write multiplexer circuitry (Wmux) 211N, and also, transistor (T5) may operate as part of read multiplexer circuitry (Rmux) 213N.

Also, in reference to bitline (nbln), the second part 200B may include precharge transistors (T6, T7) coupled in series to the bitline (bln), wherein transistor (T6) is coupled between bitline (bln) and transistor (T7), and transistor (T7) is coupled between transistor (T6) and ground (Vss or Gnd). The gate of transistor (T6) is coupled to the gate of pass transistor (T8), and the gate of transistor (T7) receives a read activation signal (nyprn). The second part 200B may include pass transistors (T8, T9) that are coupled in parallel between bitline (bln) and the write clock (WC) circuitry 228N, wherein the gate of transistor (T8) receives the write activation signal (ypwn), and the gate of transistor (T9) receives the complementary write activation signal (nypwn). In addition, the second part 200B may include another pass transistor (T10) that is coupled between the bitline (nbln) and the sense amplifier 220N, and also, the gate of transistor (T10) receives the complementary read activation signal (yprn). In some instances, transistors (T8, T9) may operate as part of write multiplexer circuitry (Wmux) 211N, and transistor (T10) may operate as part of read multiplexer circuitry (Rmux) 213N. Also, the write clock (WC) circuitry 228N and the sense amplifier 220N may be cross-coupled between the bitlines (bln, nbln).

In some implementations, as shown in FIGS. 2A-2B, the wordline (WL) may be coupled together via encircled element A. Bitline (bl0) in the first part 200A and bitline (bln) in the second part 200B may be coupled together as a shared bitline (shared_bl) via the encircled element B, and bitline (bl0) in the first part 200A and bitline (bln) in the second part 200B may be coupled together as a shared read bitline (shared_blr) via the encircled element C. Further, bitline (nbl0) in the first part 200A and bitline (nbln) in the second part 200B may be coupled together as another shared bitline (shared_nbl) via the encircled element D, and bitline nbl0 in the first part 200A and bitline (nbln) in the second part 200B may be coupled together as another shared read bitline (shared_nblr) via the encircled element E.

As shown in FIG. 2C, the write clock (wclk) circuitry 228 may include one or more logic gates (e.g., LG1, LG2) that receive input signals (e.g., data, ndata, nwclk) and provides output signals (e.g., shared_bl, shared_nbl). For instance, a first logic gate (LG1) may include use of a NOR gate, and the first logic gate (LG1) may receive input signals (data, nwclk) and provide an output signal (shared_bl). Also, a second logic gate (LG2) may include use of a NOR gate, and the second logic gate (LG2) may receive input signals (ndata, nwclk) and provide an output signal (shared_nbl). In some instances, the input data signal and the input ndata signal may be complementary, and the input nwclk signal may refer to a complement to the write clock signal (wclk). Also, in some instances, the output signals (shared_bl, shared_nbl) may be complementary shared bitline signals. In various implementations, the write clock (WC) circuitry 228A, 228N may be used in the column multiplexer circuitry 200 of FIGS. 2A, 2B.

FIG. 3 illustrates a block diagram of memory circuitry 300 in accordance with various implementations described herein. In some instances, the memory circuitry 300 may be referred to as memory access circuitry 302.

The memory circuitry 300 may be implemented as an integrated circuit (IC) in various types of memory, such as, e.g., random access memory (RAM), including static RAM (SRAM), magneto-resistive RAM (MRAM), and/or any similar memory. The memory circuitry 300 may also be implemented as an IC with single-port memory architecture and related circuitry. The memory circuitry 300 may also be integrated with computing circuitry and related components on a single chip. The memory circuitry 300 may be implemented in various embedded systems for various electronic, mobile and Internet-of-things (IoT) applications, including low power sensor nodes.

As shown in FIG. 3, the memory circuitry 300 may include various circuitry including an address decoder 304, an array of bitcells 306, multiplexer circuitry 303, clock generation circuitry 310, and dummy wordline (DWL) circuitry associated with DWL load 314. The memory circuitry 300 may include the array of bitcells 306 having multiple rows of bitcells row_0, row_1, row_2, . . . , row_n. The multiplexer circuitry 303 may be coupled to each of the bitcells in each of the rows of bitcells row_0, row_1, row_2, . . . , row_n via complementary bitlines (BL, NBL). The memory circuitry 300 may include a number of inverted wordlines (e.g., nwl_0, nwl_1, nwl_2, . . . , nwl_n) that are coupled between the address decoder 304 and the corresponding rows of bitcells row_0, row_1, row_2, . . . , row_n for access to each of the bitcells based on a selected wordline. In some instances, each of the inverted wordlines nwl_0, nwl_1, nwl_2, . . . , nwl_n may include a corresponding wordline driver (e.g., inverters i0, i1, i2, . . . , in) coupled thereto to provide wordlines signals (e.g., wl_0, wl_1, wl_2, . . . , wl_n) to the corresponding rows of bitcells row_0, row_1, row_2, . . . , row_n.

The memory circuitry 300 may receive a clock signal CLK and an address signal Addr. The clock generation circuitry (Clkgen) 310 may receive the clock signal CLK and provide one or more internal clock signals, such as, e.g., a first internal clock signal i_clk to the address decoder 304 and a second internal clock signal ngtp to a dummy wordline driver (e.g., inverter id) via a dummy wordline (DWL). The second internal clock signal ngtp may refer to complementary global timing pulse signal. The address decoder 304 may receive multiple signals including, e.g., the address signal Addr and the first internal clock signal i clk, and then access at least one inverted wordline (e.g., nwl_0, nwl_1, nwl_2, . . . , nwl_n) based on the received address signal Addr.

As further shown in FIG. 3, the memory circuitry 300 may include the dummy wordline (DWL) driver (id), the dummy wordline (DWL) load 314, and control logic circuitry 316 coupled to the dummy wordline DWL. As shown, the control logic circuitry 316 may be coupled to the multiplexer circuitry 303, wherein the control circuitry 316 may provide a write clock signal (wclk) to write driver (WD) circuitry 307, and the control circuitry 316 may also provide complementary y-mux signal (nyw<0:n>) to write multiplexer circuitry (Wmux) 311. Also, as shown, the control logic circuitry 316 may be coupled to the clock generation circuitry (Clkgen) 310, wherein the control logic circuitry 316 may receive the clock signal (ngtp) from the clock generation circuitry (Clkgen) 310 and provide a reset signal (reset) to the clock generation circuitry (Clkgen) 310. Also, as shown, the control logic circuitry 316 may be coupled to the DWL load 314 and receive a DWL turn signal (dwl_turn) from the DWL load 314.

The multiplexer circuitry 303 may include write multiplexer circuitry (Wmux) 311, read multiplexer circuitry (Rmux) 313, write driver (WD) circuitry 307, sense amplifier (SA) circuitry 308, input driver+ph2 latch circuitry 331, and output driver+latch circuitry 333. The Wmux 311 and the WD 307 may be coupled to the bitlines (BL, NBL) as shared bitlines (shared_bl, shared_nbl), respectively. Also, the Rmux 313 and the SA 308 may be coupled to the bitlines (BL, NBL) as shared read bitlines (shared_blr, shared_nblr), respectively. The input driver+ph2 latch circuitry 331 may be coupled to the WD 307 so as to provide input data thereto, and the output driver+latch circuitry 333 may be coupled to the SA 308 so as to receive output data therefrom.

In various implementations, each bitcell in the array of bitcells 306 may also be referred to as a memory cell, and each bitcell may be configured to store at least one data bit value (e.g., a data value associated with logical '0' or '1'). Each row of bitcells row_0, row_1, row_2, . . . , row_n in the array of bitcells 306 may include any number of bitcells or memory cells arranged in various configurations, such as, e.g., a two-dimensional (2D) memory array having columns and rows of multiple bitcells arranged in a 2D grid pattern type of architecture. Also, each bitcell may be implemented with random access memory (RAM) circuitry, or some other type of volatile type memory. For instance, each memory cell may include a multi-transistor static RAM (SRAM) cell, including various types of SRAM cells, such as, e.g., 6T CMOS SRAM and/or other types of complementary MOS (CMOS) SRAM cells, such as, e.g., 4T, 8T, 10T, or more transistors per bit. In other instances, each bitcell may include a multi-layer MRAM bitcell having free-layers and pinned layers, e.g., when tracking may be needed on an associated CLK2Q path.

In various implementations, the memory circuitry 300 may be implemented as a system or a device having various integrated circuit (IC) components that are arranged and coupled together as an assemblage or combination of parts that provide for a physical circuit design and related structures. In some instances, a method of designing, providing and building the memory circuitry 300 as an integrated system or device may involve use of the various IC circuit components described herein so as to thereby implement read and write memory access schemes and techniques associated therewith.

In reference to FIG. 3, the memory circuitry 300 may be implemented and/or fabricated as single port memory architecture having the bitcell array 306 and one or more wordlines (e.g., wl_0, wl_1, wl_2, . . . , wl_n) coupled to multiple columns of the bitcell array 306. Also, the memory circuitry 300 may include various logic circuitry and components (e.g., control logic 316) that are configured to perform multiple memory access operations concurrently in the single port memory architecture. In some instances, the concurrent memory access operations may include performing a read operation in one column of the bitcell array 306 using at least one of the wordlines while performing a write operation in another column of the bitcell array 306 using the same wordline. In other instances, the concurrent memory access operations may include performing a write operation in one column of the bitcell array 306 using at least one of the wordlines while performing a read operation in another column of the bitcell array 306 using the same wordline. In addition, different memory addresses (e.g., Addr) may be used to perform multiple memory access operations concurrently in the bitcell array 306 of the single port memory, and also, the different memory addresses (e.g., Addr) may refer to using a write column address (WCA) and/or using a read column address (RCA) that is different than the write column address (WCA). The address decoder 304 may receive the write column address (WCA) and the read column address (RCA) as address signals (e.g., Addr).

As shown in FIG. 3, the memory circuitry 300 may include control logic 316 that may be used as logic circuitry to assist with concurrent read and write memory access operations. For instance, the control logic 316 may include a column multiplexer that is coupled to the bitcell array 306 for accessing bitcells in the bitcell array 306 in combination with a wordline (e.g., wl_0, wl_1, wl_2, . . . , wl_n). In this instance, the control logic 316 may be configured to track the dummy wordline (DWL) having one or more fixed delays coupled along the self-timed path (STP) of the dummy wordline (DWL), and also, the one or more fixed delays may affect timing of the write clock signal (nwclk) that is provided to the column multiplexer. The column multiplexer and various components related thereto are described in greater detail herein below in reference to FIGS. 4A-4B.

Figure 4A:
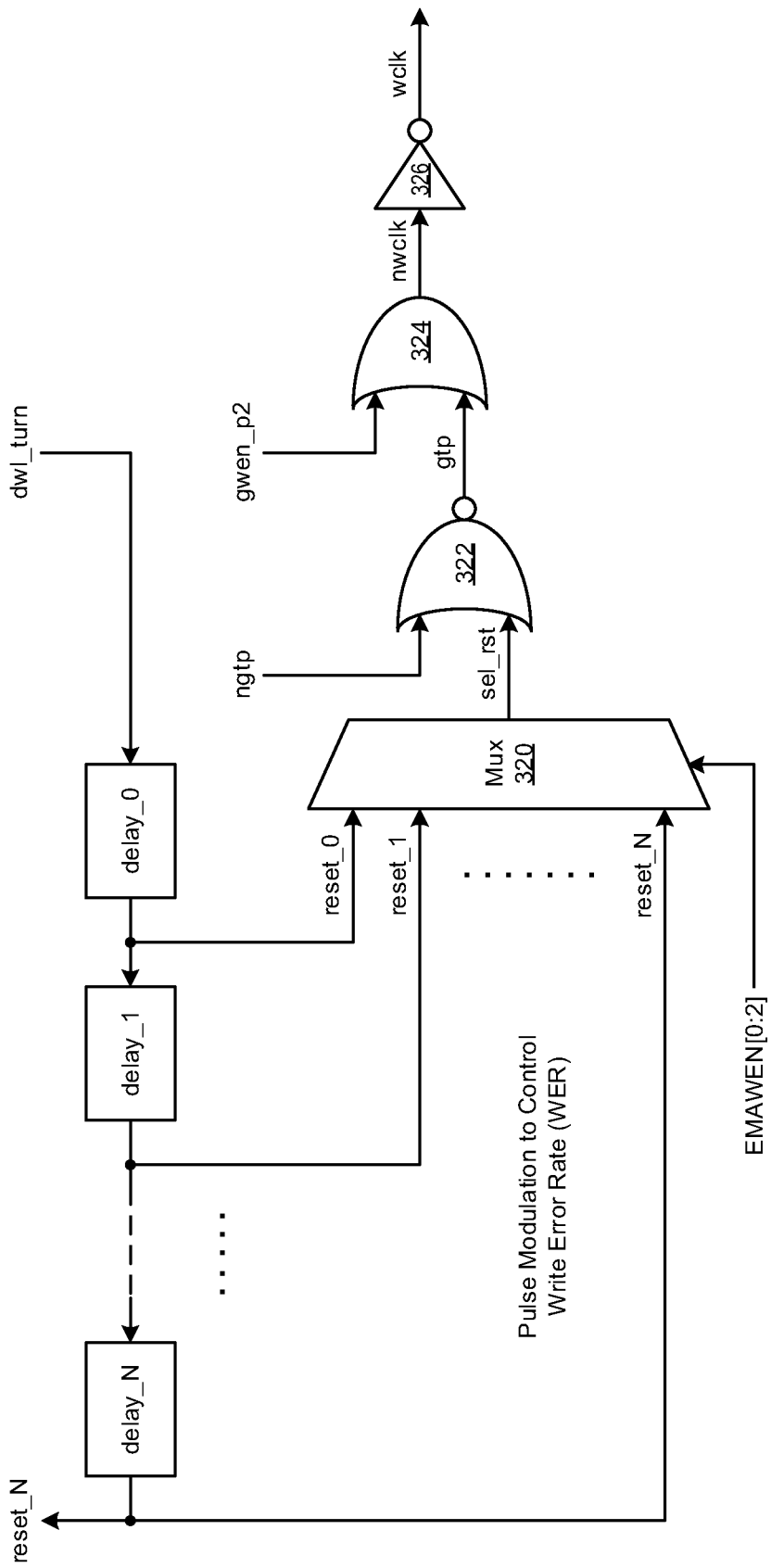
FIGS. 4A-4B illustrate various diagrams of control logic circuitry in accordance with various implementations described herein.
Figure 4B:
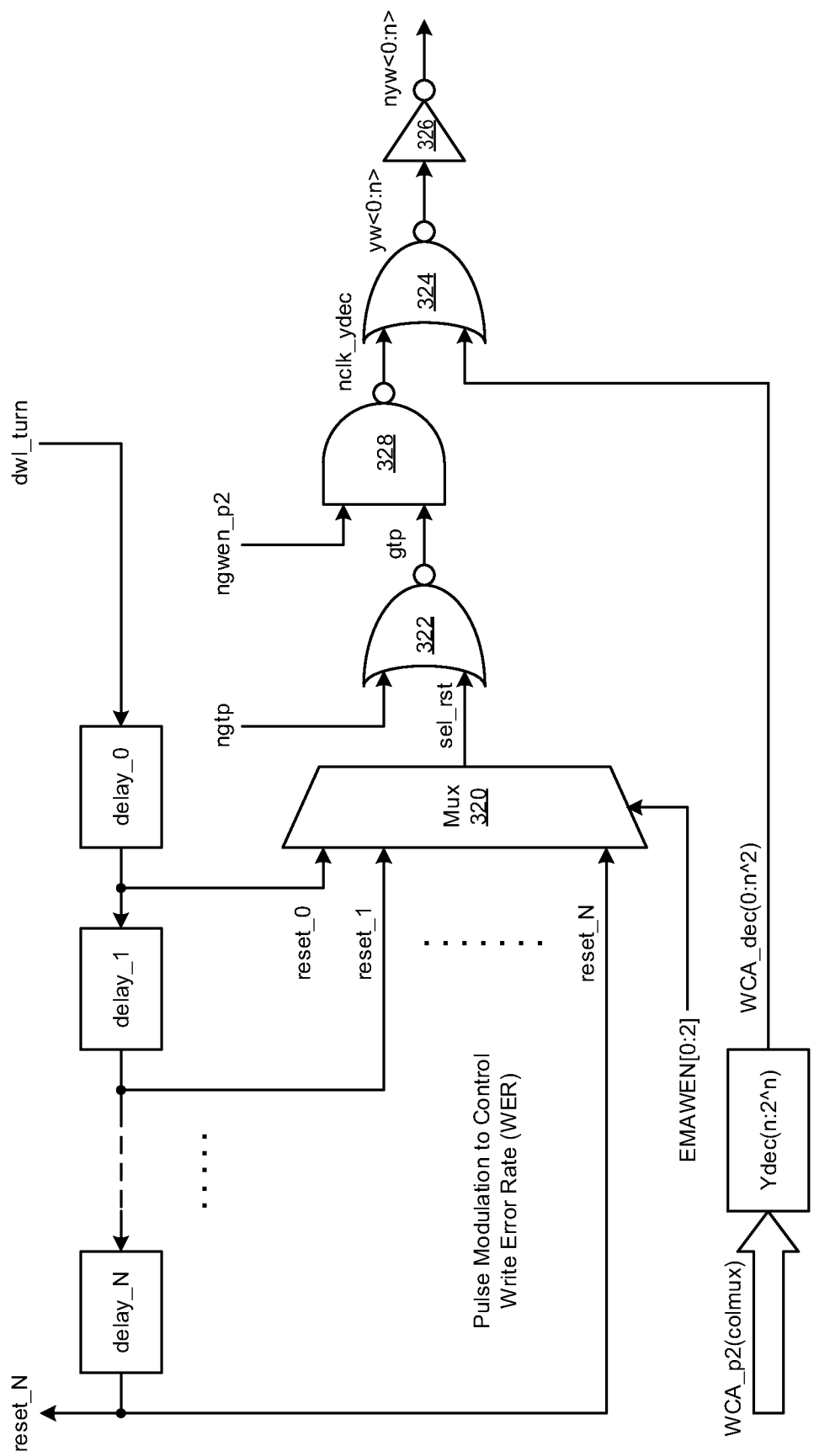

FIGS. 4A-4B illustrate diagrams of control logic circuitry 316 in accordance with implementations described herein. In particular, FIG. 4A illustrates a diagram 400A of first control logic circuitry 316A in a first delay configuration, and FIG. 4B illustrates a diagram 400B of second control logic circuitry 316B in a second delay configuration that is different than the first delay configuration. In various implementations, the first control logic 316A shown in FIG. 4A and/or the second control logic 316B shown in FIG. 4B may be utilized as part of the control logic 316 in FIG. 3.

As shown in FIG. 4A, the first control logic 316A may include any number (N) of fixed delays (e.g., delay_0, delay_1, . . . , delay_N) that are coupled in series to receive the dwl_turn signal from the DWL load 314 (FIG. 3) and provide the same number (N) of reset signals (e.g., reset_0, reset_1, . . . , reset_N) corresponding to the fixed delays (e.g., delay_0, delay_1, . . . , delay_N). Also, the first control logic 316A may include a multiplexer (Mux) 320 that receives the reset signals (e.g., reset_0, reset_1, . . . , reset_N) and provides a selected reset signal (sel_rst) as an output signal based on a write enable signal (EMAWEN[0:2]). Also, the first control logic 316A may include one or more logic gates (e.g., LG: 322, 324, 326) that are arranged to receive the selected reset signal (sel_rst) from the multiplexer (Mux) 320, receive input signals (e.g., ngtp, gwen_p2), and provide the write clock signal (wclk) to the write driver (WD) circuitry (FIG. 3).

In some implementations, the one or more fixed delays (e.g., delay_0, delay_1, . . . , delay_N) may include a first fixed delay (delay_0), a second fixed delay (delay_1), and a last fixed delay (delay_N). In this instance, the first fixed delay (delay_0) may receive the dwl_turn signal from the DWL load 314 (FIG. 3) and provide a first reset signal (reset_0) to a first input of the multiplexer (Mux) 320. Also, the second fixed delay (delay_1) may receive the first reset signal (reset_0) from the first fixed delay (delay_0) and provide a second reset signal (reset_1) to a second input of the multiplexer (Mux) 320. Also, the last fixed delay (delay_N) may receive the second reset signal (reset_1) from the second fixed delay (delay_1) and provide a last reset signal (reset_N) to a last input of the multiplexer (Mux) 320. In addition, the last fixed delay (delay_N) may provide the last reset signal (reset_N) to the clock generation circuitry (Clkgen) 310.

In some implementations, the one or more logic gates (e.g., LG: 322, 324, 326) may include a first logic gate 322 (e.g., LG: NOR gate), a second logic gate 324 (e.g., LG: OR gate), and a third logic gate 326 (e.g., LG: Inverter gate). In this instance, the first logic gate 322 receives the selected reset signal (sel_rst) from the multiplexer (Mux) 320, receives the global timing pulse signal (ngtp) from the clock generation circuitry (Clkgen) 310 (FIG. 3), and provides a complementary global timing pulse signal (gtp) to the second logic gate 324. Also, the second logic gate 324 receives the global write enable signal (gwen_p2) from an external source, receives the complementary global timing pulse signal (gtp) from the first logic gate 322, and provides the complementary write clock signal (nwclk) to the third logic gate 326. Also, the third logic gate 326 receives the complementary write clock signal (nwclk) from the second logic gate 324 and provides the write clock signal (wclk) to the write driver (WD) circuitry 307 (FIG. 3).

In some implementations, the first control logic 316A may be configured to track the dummy wordline (DWL) via the ngtp timing signal and/or the dwl_turn signal by using the fixed delays (e.g., delay_0, delay_1, . . . , delay_N) coupled along the self-timed path (STP) of the dummy wordline (DWL), and the fixed delays (e.g., delay_0, delay_1, . . . , delay_N) may be used to affect timing of a write clock signal (wclk, nwclk) that is provided to the column multiplexer circuitry 303 (FIG. 3). Also, the first control logic 316A may be configured to control the pulse width of the write clock signal (wclk, nwclk) based on using the fixed delays (e.g., delay_0, delay_1, . . . , delay_N) in the self-timed path (STP) of the dummy wordline (DWL), and the first control logic 316A may be configured to modulate the pulse width of the write clock signal (wclk, nwclk) to increase a write error rate (WER) without impacting the read operation.

In some implementations, the multiplexer (Mux) 320 may be referred to as a write multiplexer select clock, wherein as shown in FIG. 4A, the write multiplexer select clock and the logic gates (e.g., LG: 322, 324, 326) may be coupled between the self-timed path (STP) of the dummy wordline (DWL) and the column multiplexer circuitry 303 (FIG. 3). Also, outputs of the fixed delays (e.g., delay_0, delay_1, . . . , delay_N) are provided as inputs to the write clock multiplexer (Wmux) that selectively provides a reset signal (sel_rst) based on a selection signal (EMAWEN[0:2]). In addition, the logic gates (e.g., delay_0, delay_1, . . . , delay_N) may be arranged to receive the reset signal (sel_rst), receive the global timing pulse signal (ngtp), receive the global write enable signal (gwen_p2), and provide the write clock signal (wclk) to the column multiplexer circuitry 303 (FIG. 3).

As shown in FIG. 4B, the second control logic 316B may be similar to the first control logic 316A, except for the addition of a fourth logic gate 328 (e.g., LG: NAND gate) and column Y-decoder (Ydec(n:2^n)). Thus, in FIG. 4B, the second control logic 316B has similar components with similar scope, operational behaviors, and characteristics as to similar components used in the first control logic 316A of FIG. 4A.

For instance, in some implementations, the second control logic 316B includes the multiplexer (Mux) 320 that receives reset signals (e.g., reset_0, reset_1, . . . , reset_N) and provides the selected reset signal (sel_rst) as an output signal based on the write enable signal (EMAWEN[0:2]). As shown, the column Y-decoder (Ydec(n:2^n)) receives a write column address (WCA_p2) from the column multiplexer (colmux) and provides a decoded write column address (WCA_dec(0:n^2) to the second logic gate 324. Also, the second control logic 316B may include one or more logic gates (e.g., LG: 322, 324, 326, 328) that are arranged to receive the selected reset signal (sel_rst) from the multiplexer (Mux) 320, receive one or more input signals (e.g., ngtp, ngwen_p2, WCA_dec(0:n^2)), and provide the complementary y-mux signal (nyw<0:n>) to the write multiplexer circuitry (Wmux) 311 (FIG. 3).

In some implementations, the one or more logic gates (e.g., LG: 322, 324, 326, 328) may include the first logic gate 322 (e.g., LG: NOR gate), the second logic gate 324 (e.g., LG: NOR gate), the third logic gate 326 (e.g., LG: Inverter gate), and the fourth logic gate 328 (e.g., LG: NAND gate). As shown, the first logic gate 322 receives the sel_rst signal from the Mux 320, receives the global timing pulse signal (ngtp) from the Clkgen 310 (FIG. 3), and provides the gtp signal to the fourth logic gate 328. The fourth logic gate 328 receives the gtp signal from the first logic gate 322, receives the ngwen_p2 signal from an external source, and provides a clock signal (nclk_ydec) to the second logic gate 324. The second logic gate 324 receives the nclk_ydec signal from the fourth logic gate 328, receives the WCA_dec(0:n^2) signal from the column Y-decoder (Ydec(n:2^n)), and provides the y-mux signal (yw<0:n>) to the third logic gate 326. Also, the third logic gate 326 receives the y-mux signal (yw<0:n>) from the second logic gate 324 and provides the complementary y-mux signal (nyw<0:n>) to the write multiplexer circuitry (Wmux) 311 (FIG. 3).

In some implementations, as with the first control logic 316A in FIG. 4A, the second control logic 316B in FIG. 4B may also be configured to control the pulse width of the write clock signal (wclk, nwclk) based on using fixed delays (e.g., delay_0, delay_1, . . . , delay_N) in the self-timed path (STP) of the dummy wordline (DWL). In this instance, the second control logic 316B may be configured to modulate the pulse width of the write clock signal (wclk, nwclk) so as to increase the write error rate (WER) without impacting the read operation. Also, in a similar manner, the Mux 320 may be referred to as a write multiplexer select clock, wherein as shown in FIG. 4B, the Mux 320 and the logic gates (e.g., LG: 322, 324, 326, 328) may be coupled between the self-timed path (STP) of the dummy wordline (DWL) and the column multiplexer circuitry 303 (FIG. 3).

Figure 5:
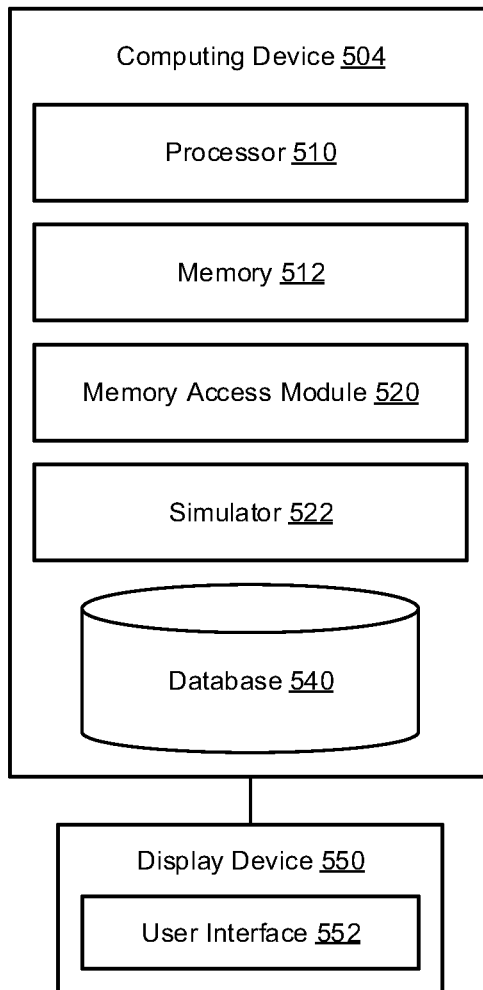
FIG. 5 illustrates a diagram of a computer system for providing read and write memory access schemes and techniques in physical layout design in accordance with various implementations described herein.

FIG. 5 illustrates a diagram of a computer system 500 for providing read and write memory access schemes and techniques in physical memory designs in accordance with various implementations described herein.

In reference to FIG. 5, the system 500 may be associated with at least one computing device 504 that is implemented as a special purpose machine configured for implementing memory access techniques in physical memory design. In some instances, the computing device 504 may include any standard element(s) and/or component(s), including at least one processor 510, memory 512 (e.g., non-transitory computer-readable storage medium), one or more database(s) 540, power, peripherals, and various other computing elements and/or components that may not be specifically shown in FIG. 5. Also, the computing device 504 may include instructions recorded or stored on the non-transitory computer-readable medium 512 that are executable by the processor 510. The computing device 504 may be associated with a display device 550 (e.g., monitor or other display) that may be used to provide a user interface (UI) 552, such as, e.g., a graphical user interface (GUI). In some instances, the UI or GUI 552 may be configured to receive various parameters and/or preferences from a user for managing, operating, and/or controlling the computing device 504. Thus, the computing device 504 may include the display device 550 for providing output to a user, and also, the display device 550 may include the UI 552 for receiving input from the user.

In reference to FIG. 5, the computing device 504 may have a memory access module 520 that may be configured to cause the at least one processor 510 to implement various schemes and techniques described herein in reference to FIGS. 1-4B, including various read and write memory access schemes and techniques related to implementing integrated circuitry in physical memory design. The memory access module 520 may be implemented in hardware and/or software. In some instances, if implemented in software, the memory access module 520 may be stored in memory 512 or database 540. Also, if implemented in hardware, the memory access module 520 may be a separate processing component that is configured to interface with the processor 510.

In some instances, the memory access module 520 may be configured to cause the processor 510 to perform various operations, as provided herein in reference to read and write memory access schemes and techniques described in FIGS. 1-4B. As such, the memory 512 has stored thereon instructions that, when executed by the processor 510, cause the processor 510 to perform one or more of the following operations.

For instance, the memory access module 520 may be configured to cause the at least one processor 510 to access single port memory having a bitcell array. The memory access module 520 may be configured to cause the at least one processor 510 to access a wordline of the single port memory including accessing columns of the bitcell array with the wordline. In some implementations, the single port memory refers to static random access memory (SRAM) or magneto-resistive RAM (MRAM), and the first bitcell array and the second bitcell array may include SRAM bitcells or MRAM bitcells.

The memory access module 520 may be configured to cause the at least one processor 510 to perform multiple memory access operations concurrently in the single port memory. For instance, the memory access module 520 may be configured to perform a read operation in one column of the bitcell array using the wordline while performing a write operation in another column of the bitcell array using the same wordline. In other instances, the memory access module 520 may be configured to perform a write operation in one column of the bitcell array using the wordline while performing a read operation in another system of the bitcell array using the same wordline.

In some implementations, the memory access module 520 may be configured to cause the at least one processor 510 to track a dummy wordline having fixed delays coupled along a self-timed path of the dummy wordline. Also, the fixed delays may affect timing of a write clock signal provided to a column multiplexer coupled to the bitcell array for accessing bitcells in the bitcell array in combination with the wordline.

In some implementations, the memory access module 520 may be configured to cause the at least one processor 510 to control pulse width of the write clock signal based on using the fixed delays in the self-timed path of the dummy wordline. In some instances, the memory access module 520 may be configured to cause the at least one processor 510 to modulate the pulse width of the write clock signal so as to increase the write error rate (WER) without impacting the read operation.

In accordance with various implementations described herein in reference to FIGS. 1-4B, any one or more or all of these operations performed by the memory access module 520 may be altered, modified, changed and/or updated so as to thereby provide various specific embodiments as shown in FIGS. 1-4B. Also, in some instances, each of the circuit components may be in a form of a physical structure having various shapes with length, width and/or various other spatial definitions, and the physical structure may be associated with an integrated circuit that is included in a place and route environment for DRC and various rules associated therewith.

Further, in reference to FIG. 5, the computing device 504 may include a simulator 522 that is configured to cause the at least one processor 510 to generate one or more simulations of the circuit layout and related components. The simulator 522 may be referred to as a simulating component or module that may be implemented in hardware or software. If implemented in software, the simulator 522 may be recorded and/or stored in memory 512 or database 540. If implemented in hardware, the simulator 522 may be a separate processing component configured to interface with the processor 510. In some instances, the simulator 522 may refer to a SPICE simulator that is configured to generate SPICE simulations of the cell layout and related components. Generally, SPICE refers to an acronym for Simulation Program with Integrated Circuit Emphasis, which is an open source analog electronic circuit simulator. Also, SPICE may refer to a general-purpose software program used by the semiconductor industry to check the integrity of physical structure designs and to predict the behavior of physical structure designs. Thus, the memory access module 520 may be configured to interface with the simulator 522 so as to generate various timing data based on one or more simulations (including, e.g., SPICE simulations) of the circuit layout and related components that are used for analyzing performance characteristics of the integrated circuit including timing data of the circuit layout and related components. Also, the memory access module 520 may be configured to use the one or more simulations (including, e.g., SPICE simulations) of the circuit layout and related components for evaluating operating behavior and conditions thereof.

In some implementations, the computing device 504 may include one or more databases 540 configured to store and/or record various data and information related to implementing read and write access techniques in physical design. In various instances, the database(s) 540 may be configured to store and/or record data and information related to integrated circuitry, operating conditions, operating behavior and/or timing data of the circuit layout and related components. Also, the database(s) 540 may be configured to store data and information related to the circuit layout and related components and timing data in reference to simulation data (including, e.g., SPICE simulation data).

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a method for providing single port memory with a bitcell array arranged in columns and rows. The method may include coupling a wordline to the single port memory including coupling the wordline to the columns of the bitcell array. The method may include performing multiple memory access operations concurrently in the single port memory including performing a read operation in one column of the bitcell array using the wordline while performing a write operation in another column of the bitcell array using the wordline, or performing a write operation in one column of the bitcell array using the wordline while performing a read operation in another column of the bitcell array using the same wordline.

Described herein are various implementations of a device having single port memory architecture with a bitcell array. The device may include multiple wordlines that are coupled to multiple columns of the bitcell array. The device may include logic circuitry that performs multiple memory access operations concurrently in the single port memory architecture including performing a read operation in one column of the bitcell array using one wordline of the multiple wordlines while performing a write operation at the same time in another column of the bitcell array using another wordline of the multiple wordlines, or performing a write operation in one column of the bitcell array using one wordline of the multiple wordlines while performing a read operation at the same time in another column of the bitcell array using another wordline of the multiple wordlines.

Described herein are various implementations of a system. The system may include a processor and memory having stored thereon instructions that, when executed by the processor, cause the processor to access single port memory having a bitcell array. The instructions may cause the processor to access dual wordlines of the single port memory including accessing columns of the bitcell array with the dual wordlines. The instructions may cause the processor to perform multiple memory access operations concurrently in the single port memory including performing a read operation in one column of the bitcell array using a first wordline of the dual wordlines while performing a write operation in another column of the bitcell array using a second wordline of the dual wordlines, or performing a write operation in one column of the bitcell array using the first wordline of the dual wordlines while performing a read operation in another column of the bitcell array using the second wordline of the dual wordlines.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method, comprising:
providing single port memory with a bitcell array arranged in columns and rows;
coupling a wordline to the single port memory including coupling the wordline to the columns of the bitcell array;
performing multiple memory access operations concurrently in the single port memory including performing a read operation in one column of the bitcell array using the wordline while performing a write operation in another column of the bitcell array using the wordline, or performing a write operation in one column of the bitcell array using the wordline while performing a read operation in another column of the bitcell array using the same wordline; and
tracking a dummy wordline having fixed delays coupled along a self-timed path of the dummy wordline.

2. The method of claim 1, wherein different memory addresses are used to perform the multiple memory access operations concurrently in the bitcell array of the single port memory, and wherein the different memory addresses refer to a write column address and a read column address that is different than the write column address.

3. The method of claim 1, wherein the read operation is performed in the bitcell array with a read column address while the write operation is performed concurrently in the same bitcell array with a write column address.

4. The method of claim 1, wherein the write operation is performed in the bitcell array with a write column address while the read operation is performed concurrently in the bitcell array with a read column address.

5. The method of claim 1, wherein the single port memory has a column multiplexer coupled to the bitcell array for accessing bitcells in the bitcell array in combination with the wordline.

6. The method of claim 5, further comprising:
wherein the fixed delays affect timing of a write clock signal provided to the column multiplexer.

7. The method of claim 6, further comprising:
controlling pulse width of the write clock signal based on using the fixed delays in the self-timed path of the dummy wordline.

8. The method of claim 7, wherein controlling the pulse width of the write clock signal refers to modulating the pulse width of the write clock signal so as to increase a write error rate without impacting the read operation.

9. The method of claim 8, wherein outputs of the fixed delays are provided as inputs to a write multiplexer select clock that selectively provides a reset signal based on a selection signal, and wherein logic gates are arranged to receive the reset signal, receive a global timing pulse signal, receive a global write enable signal, and provide the write clock signal to the column multiplexer.

10. The method of claim 1, wherein the single port memory refers to static random access memory (SRAM) or magneto-resistive RAM (MRAM), and wherein the bitcell array includes SRAM bitcells or MRAM bitcells.

11. A device, comprising:
single port memory architecture having a bitcell array;
multiple wordlines coupled to multiple columns of the bitcell array; and
logic circuitry that performs multiple memory access operations concurrently in the single port memory architecture including performing a read operation in one column of the bitcell array using one wordline of the multiple wordlines while performing a write operation at the same time in another column of the bitcell array using another wordline of the multiple wordlines, or performing a write operation in one column of the bitcell array using one wordline of the multiple wordlines while performing a read operation at the same time in another column of the bitcell array using another wordline of the multiple wordlines;
wherein the logic circuitry tracks a dummy wordline having fixed delays coupled along a self-timed path of the dummy wordline.

12. The device of claim 11, wherein:
the multiple wordlines comprise dual wordlines,
different memory addresses are used to perform the multiple memory access operations concurrently in the bitcell array of the single port memory, and
the different memory addresses refer to a write column address and a read column address that is different than the write column address.

13. The device of claim 11, further comprising:
a column multiplexer coupled to the bitcell array for accessing bitcells in the bitcell array in combination with the wordline,
wherein the fixed delays affect timing of a write clock signal provided to the column multiplexer.

14. The device of claim 13, wherein:
the logic circuitry controls pulse width of the write clock signal based on using the fixed delays in the self-timed path of the dummy wordline, and
the logic circuitry modulates the pulse width of the write clock signal to increase a write error rate without impacting the read operation.

15. The device of claim 14, further comprising:
a write clock multiplexer and logic gates coupled between the self-timed path of the dummy wordline and the column multiplexer,
wherein outputs of the fixed delays are provided as inputs to the write clock multiplexer that selectively provides a reset signal based on a selection signal, and
wherein logic gates are arranged to receive the reset signal, receive a global timing pulse signal, receive a global write enable signal, and provide the write clock signal to the column multiplexer.

16. The device of claim 11, wherein the single port memory architecture refers to static random access memory (SRAM) or magneto-resistive RAM (MRAM), and wherein the bitcell array includes SRAM bitcells or MRAM bitcells.

17. A system, comprising:
a processor; and
memory having stored thereon instructions that, when executed by the processor, cause the processor to:
access single port memory having a bitcell array;
access dual wordlines of the single port memory including accessing columns of the bitcell array with the dual wordlines;
perform multiple memory access operations concurrently in the single port memory including performing a read operation in one column of the bitcell array using a first wordline of the dual wordlines while performing a write operation in another column of the bitcell array using a second wordline of the dual wordlines, or performing a write operation in one column of the bitcell array using the first wordline of the dual wordlines while performing a read operation in another column of the bitcell array using the second wordline of the dual wordlines; and
track a dummy wordline having fixed delays coupled along a self-timed path of the dummy wordline.

18. The system of claim 17, wherein the fixed delays affect timing of a write clock signal provided to a column multiplexer coupled to the bitcell array for accessing bitcells in the bitcell array in combination with the wordline.

19. The system of claim 18, wherein the instructions cause the processor to:
- control pulse width of the write clock signal based on using the fixed delays in the self-timed path of the dummy wordline, and
- modulate the pulse width of the write clock signal so as to increase a write error rate without impacting the read operation.

20. The system of claim 17, wherein the single port memory refers to static random access memory (SRAM) or magneto-resistive RAM (MRAM), and wherein the first bitcell array and the second bitcell array include SRAM bitcells or MRAM bitcells.

* * * * *